United States Patent [19]

Giannella

[11] Patent Number: 4,851,893
[45] Date of Patent: Jul. 25, 1989

[54] PROGRAMMABLE ACTIVE/PASSIVE CELL STRUCTURE

[75] Inventor: Piccolo G. Giannella, Saratoga, Calif.

[73] Assignee: Exar Corporation, San Jose, Calif.

[21] Appl. No.: 122,971

[22] Filed: Nov. 19, 1987

[51] Int. Cl.[4] .......................................... H01L 27/04
[52] U.S. Cl. ...................................... 357/48; 357/34; 357/35; 357/51; 357/43
[58] Field of Search ................... 357/34, 35, 51, 59 F, 357/52, 52 D, 40, 43, 48

[56] References Cited

U.S. PATENT DOCUMENTS

| | | | |
|---|---|---|---|
| 3,667,006 | 5/1972 | Ruegg | 357/35 X |
| 4,100,563 | 7/1978 | Clark | 357/35 X |
| 4,228,451 | 10/1980 | Priel et al. | 357/35 X |
| 4,288,708 | 9/1981 | Vinal | 357/35 X |
| 4,392,069 | 7/1983 | Suzuki et al. | 357/35 X |
| 4,417,265 | 11/1983 | Murkland et al. | 357/35 X |
| 4,513,306 | 4/1985 | Davies | 357/35 X |
| 4,684,970 | 8/1987 | Sloane et al. | 357/35 X |
| 4,782,378 | 11/1988 | Sekiya et al. | 357/34 |

OTHER PUBLICATIONS

Berger et al, "Current Gain in Injection Transistor Structures," *IBM Technical Disclosure Bulletin*, vol. 17, No. 12, May 75, pp. 3613-3614.
Battista et al., "Lateral PNP Structure for Memory Cell," *IBM Technical Disclosure Bulletin*, vol. 18, No. 10, Mar. 1976, pp. 3254-3255.

*Primary Examiner*—Rolf Hille
*Assistant Examiner*—William A. Mintel
*Attorney, Agent, or Firm*—Townsend and Townsend

[57] ABSTRACT

An improved cell structure which can be programmed to have resistors, an NPN transistor or a PNP lateral transistor in a linear arrangement with an open PNP structure. The PNP collector regions are made parallel to a PNP emitter, with lightly doped resistive P-regions attached to the ends of the emitter region to prevent the flow of current to the P-isolation boundary region. At least one base region is provided in line with a collector region and adjacent one of the resistive regions connected to the emitter.

11 Claims, 3 Drawing Sheets

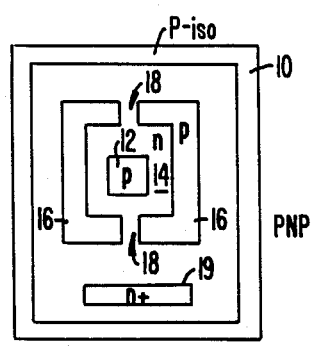
FIG._1A.
PRIOR ART
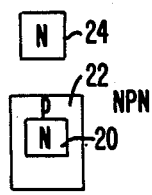
FIG._1B.
PRIOR ART
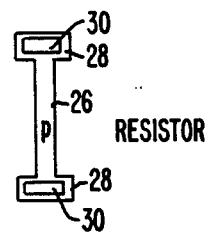
FIG._1C.
PRIOR ART
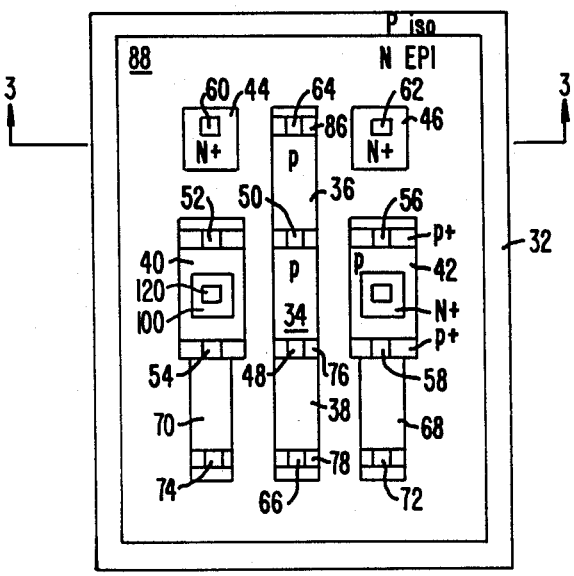
FIG._2.
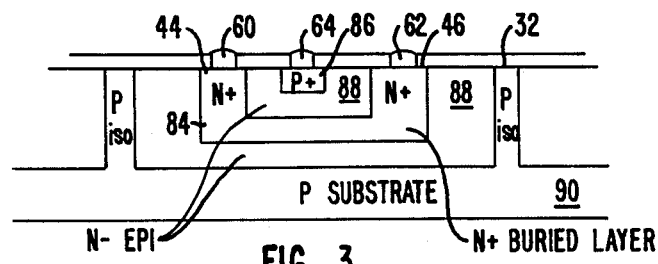
FIG._3.

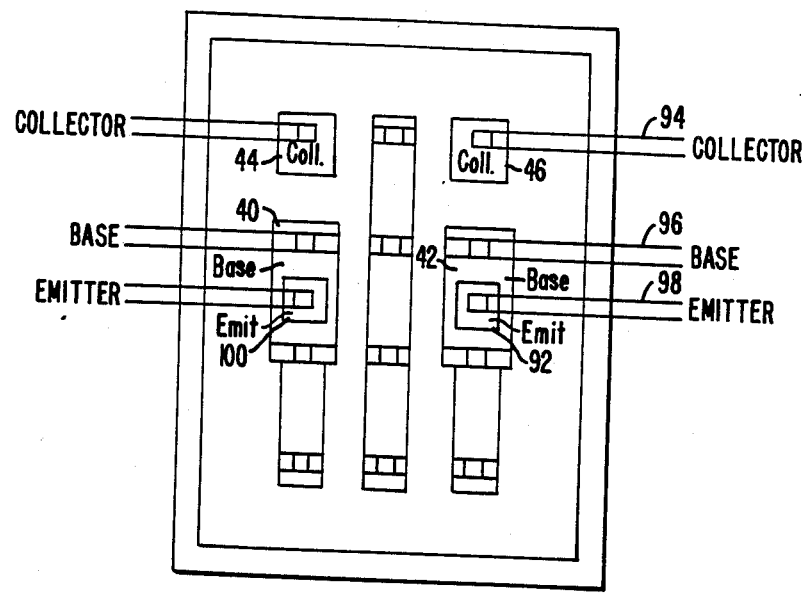
2 NPN TRANSISTORS
FIG._4.
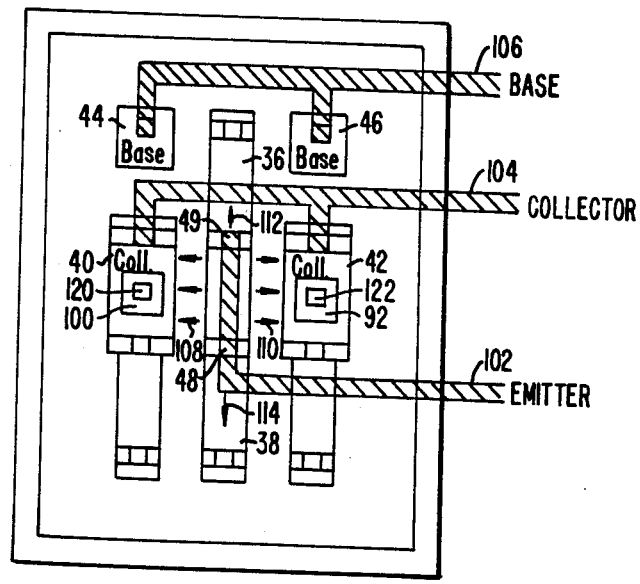
1 PNP TRANSISTOR
FIG._5.

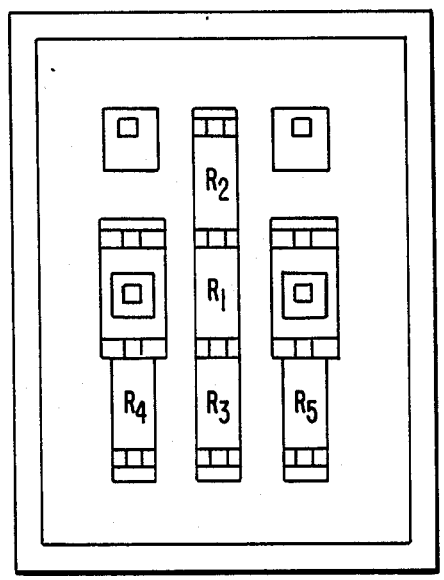
FIG._6.

PROGRAMMABLE ACTIVE/PASSIVE CELL STRUCTURE

BACKGROUND

The present invention relates to cell structures for resistors and transistors.

Although NPN transistors can be structured in a linear fashion with the emitter inside the base region and the base region in line with the collector region, the same is not true for PNP transistors. Typically, PNP transistors are arranged in a closed structure such as shown in FIG. 1A. A PNP transistor is shown in FIG. 1A surrounded by a P-isolation region 10. The transistor has an emitter 12 surrounded by a base region 14 (with a base contact 19) which is in turn surrounded by two C-shaped collector regions 16. (If only one collector is required, a single, solid region could be used.) A gap 18 between the regions insures that two separate collectors are usable. The gap 18 is kept narrow to prevent conduction between emitter region 12 and isolation region 10 by forcing the current to collector region 16. The need for the closed PNP structure of FIG. 1 with a central emitter means that the PNP transistor requires more room than an NPN transistor and is more difficult to lay out because of the nonrectangular (C) shape of the collectors.

The simpler NPN layout is shown in FIG. 1B with an emitter 20, base 22 and collector 24. As can be seen, this structure takes up less space and enables it to be arranged linearly with other elements, such as a resistor shown in FIG. 1C.

FIG. 1C shows a typical resistor having an elongate P-region 26 with widened regions 28 at each end to give a T-bone structure. The widened regions 28 are necessary to provide enough room for a metal contact 30. The larger contact areas 30 not only make it easier to make a contact, but also enables the resistor values to be matched more carefully. The larger the contact area, the less a small absolute difference in the contact areas between two resistors will make a difference in the resistor value.

SUMMARY OF THE INVENTION

The present invention is an improved cell structure which can be programmed to have resistors, an NPN transistor or a PNP lateral transistor in a linear arrangement with an open PNP structure. The PNP collector regions are made parallel to a PNP emitter, with lightly doped resistive P-regions attached to the ends of the emitter region to prevent the flow of current to the P-isolation boundary region. At least one base region is provided in line with a collector region and adjacent one of the resistive regions connected to the emitter.

The resistive regions can be used as resistors and are provided with a linear, rather than a T-bone structure. The ends of the resistors are highly doped to be P+ giving a low resistivity connection. The use of this P+ region acts as a contact to the resistor region and thus provides the same effect as the wider metal contact structure of the T-bone.

The collector regions for the PNP transistor are provided with an internal N-doped region to act as the emitter of an NPN transistor. Thus, the two collectors of the PNP transistor can alternately be used as base regions of two NPN transistors, with two bases for the PNP transistor becoming the collectors of the NPN transistors.

In one embodiment, the present invention provides a cell structure which can be programmed at the metalization stage to provide a lateral PNP transistor, two NPN transistors or five matched resistors. This cell structure is useful for semi-custom applications where the number and type of the components is not known in advance of a customer order. The structure is symmetrical and smaller than prior art structures. The structure also provides a higher frequency response than the prior art. The symmetrical structure makes circuit layout and routing simpler and automated routing is possible because all the contacts are in a grid.

For a fuller understanding of the nature and advantages of the invention, reference should be made to the ensuing detailed description taken in conjunction with the accompanying drawings.

BRIEF DESCRIPTION OF THE DRAWINGS

FIG. 1A is a diagram of a prior art PNP transistor cell;

FIG. 1B is a diagram of a prior art NPN transistor;

FIG. 1C is a diagram of a prior art resistor;

FIG. 2 is a top plan view of a resistor/transistor cell structure according to the present invention;

FIG. 3 is a sectional view along lines 3—3 of FIG. 2;

FIG. 4 is a diagram of the cell structure of FIG. 2 connected as two NPN transistors;

FIG. 5 is a diagram of the cell structure of FIG. 2 connected as a PNP transistor with two collectors; and FIG. 6 is a diagram of the cell structure of FIG. 2 connected as five resistors.

DETAILED DESCRIPTION OF THE PREFERRED EMBODIMENTS

FIG. 3 is a top, plan view of the cell according to the present invention surrounded by a P-doped isolation region 32. A P-region 34 is doped to act as the emitter of a PNP transistor with two contiguous lightly-doped resistive P-regions 36 and 38 joining it on either side. P-regions 40 and 42 act as collectors of the PNP transistor with N-regions 44 and 46 acting as the bases. This can be seen more clearly in FIG. 5

FIG. 4 shows the same structure connected as 2 NPN transistors as discussed below. The names for the emitter, base and collector of the NPN or PNP transistors in FIGS. 4 and 5 show that the same regions function differently depending upon whether the structure is connected as NPN transistors or a PNP transistor.

Emitter region 34 is provided with two contacts 48 and 50. Collector regions 40, 42 are each provided with a pair of contact regions 52, 54 and 56, 58, respectively. N-regions 44 and 46 are provided with contact regions 60 and 62, respectively.

Collector regions 40 and 42 have embedded within them N-doped regions 100 and 92, respectively, which function as emitters for an NPN configuration as shown in FIG. 4. In the center of regions 100 and 92 are contacts 120 and 122, respectively.

Resistive areas 36 and 38 can also act as resistors with contacts 50 and 48 on one side, respectively, and contacts 64 and 66 on the other side of each resistor. Finally, two additional resistor regions 68 and 70 are provided with additional contact regions 72 and 74, respectively.

Resistor 38 has each of its contacts 48 and 66 within P+ regions 76 and 78, respectively. Each of the other contacts in a P-region is also provided with a similar P+ region around the contact. These P+ regions serve to provide a larger area of connection to the resistive regions allowing the use of small, square contacts with the same quality connection as with larger, rectangular metal contacts. This not only allows the resistors to have a smaller rectangular form, giving a higher density, but also makes it easier to have all the components in a square grid, because now the resistors have the same square metal contacts as the other components. Smaller metal lines can be used and thus more metal lines can be used, resulting in easier routing. These advantages are not present when metal contacts of different shapes are used.

FIG. 3 is a cross-sectional view along lines 3—3 of FIG. 2. As can be seen from FIG. 3, the two N-regions 44 and 46 are joined by an N+ buried layer 84. This buried layer extends underneath all the components of the cell down to the region underneath contacts 74 and 72. However, the buried layer is only coupled to the surface through regions 44 and 46.

FIG. 3 also shows that metal contact 64 is coupled to a P+ region 86 at the end of resistor 36. The entire structure is supported by an N-EPI well 88 which is on top of a P substrate 90.

The connection of the cell structure of FIG. 2 as two NPN transistors is shown in FIG. 4. A first transistor is formed with region 46 as the collector, region 42 as the base and an N+ region 92 as the emitter. The collector, base and emitter metal lines 94, 96 and 98, respectively, are shown coupled to their respective regions. A second NPN transistor is formed with region 44 as the collector, region 40 as the base and an N+ region 100 as the emitter. As can be seen, each of these NPN transistors is similar in structure to the prior art NPN transistor of FIG. 1B.

FIG. 5 shows the connection of the cell of FIG. 2 as a single PNP transistor. An emitter connecting line 102 is coupled through contacts 48 and 49 to emitter region 34. The two collectors are connected together by a collector line 104 coupled to collectors 40 and 42. A base line 106 is connected to base regions 44 and 46. Alternately, two separate collectors could be provided if desired. In operation, current will flow from the emitter to the collectors in the direction indicated by arrows 108 and 110. Current in the direction indicated by arrows 112 and 114 away from the collectors will be inhibited by the resistivity of regions 36 and 38. Preferably, the resistance of these regions is at least ten times higher than the resistance of the emitter region. The gap between emitter 34 and either one of collectors 40 and 42 is preferably in the range of 4–10 microns.

FIG. 6 shows five resistors R1–R5 which can be formed from the structure of the present invention. Resistors R1, R4 and R5 have a matched resistance value of approximately 500 ohms and resistors R2 and R3 have a matched value of 5K ohms. The use of the P+ regions at the contacts enables the contact area to be smaller. The use of smaller contacts allows the metal lines connecting to the resistors of the cell to be thinner.

The cell structure of the present invention can be created in accordance with standard process techniques. Region 34 is diffused at the same time as regions 40 and 42. The P+ diffusion used for the contact regions for the resistors can be done at the same time as the high concentration diffusion already used in the base of the high frequency NPN transistors to reduce the base resistance. For low frequency processes, the top ISO diffusion can be used under the contact regions, but the size must be made smaller to take into account the larger amount of side diffusion.

The present invention thus provides a structure which can provide either two NPN transistors, a PNP transistor with two collectors, or five resistors all in the area normally required for seven resistors. The usage of only square contacts in the present invention makes a grid system more efficient and simple and provides a consistent savings in the silicon area.

As will be understood by those familiar with the art, the present invention may be embodied in other specific forms without departing from the spirit or essential characteristics thereof. For example, resistors R4 and R5 could be separated from the PNP collector regions. Accordingly, the disclosure of the preferred embodiment of the invention is intended to be illustrative, but not limiting, of the scope of the invention which is set forth in the following claims.

What is claimed is:

1. A semiconductor cell structure for a PNP transistor comprising:
   a first P-doped emitter region having a first doping level;
   at least a first P-doped collector region proximate said emitter region;
   at least one P-doped resistor region having a second doping level lower than said first doping level and being coupled to said emitter region at an edge of said emitter region not facing said collector region; and
   at least one N-doped base region proximate said emitter and collector regions.

2. The cell structure of claim 1 further comprising an N+ buried layer coupled to said base region and extending below said emitter and collector regions.

3. The cell structure of claim 1 further comprising a second P-doped collector region, said first and second collector regions being on opposite sides of said emitter region.

4. The cell structure of claim 3 further comprising a second P-doped resistor region coupled to said emitter region at an edge of said emitter region opposite said first resistor region.

5. The cell structure of claim 1 further comprising an N-doped emitter region within said collector region.

6. A semiconductor cell structure adaptable for forming a PNP transistor, comprising:
   a first elongate P-doped emitter region having two long sides, two short sides and having a first doping level;
   second and third elongate P-doped collector regions substantially parallel to said emitter region adjacent opposite long sides of said emitter region;
   fourth and fifth resistive P-doped regions coupled to opposite short sides of said emitter region and having a second doping level lower than said first doping level; and
   first and second N-doped base regions adjacent said second and third collector regions, respectively, on opposite sides of one of said fourth and fifth resistive regions.

7. The cell structure of claim 6 further comprising an N+ buried layer coupled to said base regions and extending below said emitter and collector regions.

8. The cell structure of claim 6 further comprising first and second N-doped emitter regions within said second and third collector regions, respectively.

9. The cell structure of claim 6 further comprising sixth and seventh P-doped resistor regions coupled to said second and third collector regions, respectively, on opposite sides from said N-doped base regions.

10. The cell structure of claim 6 further comprising at least one P+ region at one end of one of said fourth and fifth resistive regions.

11. A semiconductor cell structure comprising:
a first rectangular P-doped emitter region having two long sides, two short sides and having a first doping level;
second and third rectangular P-doped collector regions substantially parallel to said emitter region adjacent opposite long sides of said emitter region;
fourth and fifth resistive P-doped regions coupled to opposite short sides of said emitter region and having a second doping level lower than said first doping level;
first and second N-doped base regions adjacent second and third collector regions, respectively, on opposite sides of one of said fourth and fifth resistive regions;
an N+ buried layer coupled to said base regions and extending below said emitter and collector regions;
first and second N-doped emitter regions within said second and third collector regions, respectively;
sixth and seventh P-doped resistor regions coupled to said second and third collector regions, respectively, on opposite sides from said N-doped base regions;
at least one P+ region at one end of one of said fourth and fifth resistive regions;

* * * * *